United States Patent [19]

Lorenzen

[11] Patent Number: 4,916,806
[45] Date of Patent: Apr. 17, 1990

[54] METHOD AND DEVICE FOR MOUNTING ELECTRIC COMPONENTS ON A CIRCUIT BOARD

[76] Inventor: Klaus Lorenzen, Robert-Bosch-Strasse 18, D-7160 Gaildorf 3, Fed. Rep. of Germany

[21] Appl. No.: 294,737

[22] Filed: Jan. 9, 1989

Related U.S. Application Data

[62] Division of Ser. No. 112,388, Oct. 22, 1987, Pat. No. 4,821,152.

[30] Foreign Application Priority Data

Oct. 23, 1986 [DE] Fed. Rep. of Germany ....... 3636065

[51] Int. Cl.[4] .............................................. H05K 3/34
[52] U.S. Cl. ......................................... 29/837; 29/840
[58] Field of Search ................. 29/830, 831, 832, 834, 29/840, 837; 174/138 G; 361/403, 417–420, 394, 399

[56] References Cited

U.S. PATENT DOCUMENTS

| 3,380,016 | 4/1968 | Samson et al. | 361/403 X |
| 4,619,431 | 10/1986 | Matsui et al. | 174/138 G X |
| 4,728,753 | 3/1988 | Nakano | 174/138 G X |
| 4,813,642 | 3/1989 | Matsui | 174/138 G X |

FOREIGN PATENT DOCUMENTS

0033472 1/1981 European Pat. Off. .

Primary Examiner—Timothy V. Eley
Attorney, Agent, or Firm—Darby & Darby

[57] ABSTRACT

In connection with a method and a device for mounting electric components, such as coils, anti-interference coils, transformers, transistors, capacitors, or the like, on a circuit board, it is proposed to give the carrier housing for the electric component a two-part design and to lock the lower part directly on the printed circuit board, while an upper housing part serving as a component carrier may be locked in two different positions on the lower housing part. In the first, extended locking position of the two housing parts detent legs provided on the lower housing part can be brought into locking engagement with passages in the printed circuit board, if necessary by an additional rotary movement, while in the compressed position locking webs projecting from the upper housing part engage and fix the said detent legs from the rear or laterally, and electric connection wires projecting from the electric component may, if desired, be guided by means of wire-guiding sleeves provided on the housing through, corresponding passage openings in the printed circuit board, simultaneously with and due to the compression of the housing parts.

7 Claims, 5 Drawing Sheets

METHOD AND DEVICE FOR MOUNTING ELECTRIC COMPONENTS ON A CIRCUIT BOARD

This is a division, of application Ser. No. 112,388 filed Oct. 22, 1987 now U.S. Pat. No. 4,821,152.

BACKGROUND OF THE INVENTION

The present invention relates to a method according to the preamble of claim 1 and a device according to the preamble of claim 4. Methods of mounting electric components on wiring boards or printed circuit boards are known.

Generally, electric components of any desired type can be fastened on wiring boards or printed circuit boards or other large-area supports by positioning them on the circuit board, together with their housing, and by providing the housing for example with mounting flanges through which fixing means, such as screws or the like, can be passed for screwing the elements in place on the circuit board. Another known method consists in positioning the electric components directly on the circuit board and passing the connection wire ends through bores in the circuit board and soldering them on the opposite face thereof. This method is frequently used for resistors, transistors, or the like because in these cases the connection wires are sufficiently strong to carry the mass of such a component safely and to secure it against vibration.

Larger components require, however, separate mounting means which may for example be designed in such a manner that the housings accommodating or carrying such components are provided with detent legs which exhibit pronounced nose-shaped projections. The legs are passed through corresponding openings in the circuit board to engage the circuit board from the bottom so that the components are clamped and fixed in place in a form-locking manner. However, problems are encountered with such components which are clipped and clamped in place by means of locking noses coacting with recesses in the carrier plate. In particular, when the components in question are big and heavy, as in the case of transformers, capacitors, relays, anti-interference coils, or the like, and when the printed circuit boards on the other hand are subjected, during operation of the equipment in which they are installed, to vibration, movements or oscillation, the detent legs, which retain the components in position only by their initial stress may upon corresponding transverse acceleration, come out of the openings of the printed circuit board.

It has, therefore, been proposed in connection with the known mounting means for electric components to provide fixing legs adjacent the detent legs exhibiting the locking noses. This forms an additional contact face for the opening in the carrier plate so that, after engagement of the locking noses, the free space required for permitting the locking noses to give way and engage the board is taken up and the whole locking means come to rest flush against the walls of the openings in the carrier boards.

This may, however, lead to a quite considerable increase in complexity of the shape of the housings carrying the components, in the area of the mounting and locking means. In addition, a certain distance has to be maintained between the detent leg and the related fixing leg to permit the initial deflection of the detent leg which is required to permit the locking nose to pass through the opening in the circuit board which is then engaged by it.

Reverting once more to the locking arrangement using simple detent legs, which in the case of a component of circular cross-section may, for example, be set off relative to each other by 90° or 120°, with the locking noses pointing outwardly, the cross-section of the opening in the printed circuit board must at least be large enough to permit the head of the respective detent leg, which carries the locking nose, to pass if the respective detent leg with the locking nose extending vertically to the direction of introduction, i.e. in the transverse direction, is to be introduced. After engagement of the bottom surface of the circuit board, one necessarily always obtains a gap corresponding to the projection formed by the locking nose in the transverse direction; otherwise it would not be possible to pass the respective detent leg through the corresponding receiving opening. For the usual mounting method by means of detent legs this means that the component is always held loosely in its mounting hole, and this possibly also when, as mentioned before, several such detent legs with locking noses pointing in different directions are provided. Even if the detent legs are biased appropriately to be urged outwardly into contact with the wall of the opening after engagement of the board, greater acceleration effects acting in the transverse direction may cause the component to tilt and to be jammed in the receiving openings, due to the still existing tolerances, so that under certain circumstances one or more of the detent legs may come off their engaged position. Accordingly, an acceleration effect acting in a different direction may cause all the detent legs to come free. The respective electric component, for example a transformer which is always relatively heavy due to its content of heavy iron, or an anti-interference coil, or a capacitor, are then detached from the carrier plate which leads not only to considerable damage, but in any case also to destruction of the corresponding electric functions of the unit.

Further, it is not possible in the case of the known means for mounting electric components on printed circuit boards, to realize or, at least, to prepare the electric connection simultaneously with a mounting process of this type. For example, if transformers, anti-interference coils or capacitors have to be arranged, it is necessary to connect soldering pins with the normally relatively thin connection wires of the windings of a transformer or of a coil. These pins are then seated in suitable recesses of the housing extending towards the circuit boards a length sufficient to ensure that during mounting of the housing, the soldering pins can be passed through suitable bores in the circuit board to enable them to be soldered on the reverse side, i.e. on the conductor side of the circuit board. Although it is sometimes possible to do without such separate soldering pins, namely when the connection wires are relatively thick, it is still necessary in this case to thread the wires carefully through the associated holes, or at least to bring them into proper alignment with the latter. Still, during assembly, it happens rather often that when the detent legs are pressed home the respective electric connection pin, i.e. soldering pin or connection wire, gets tilted in its opening, is dislodged upwardly, comes off its seat, and may even be torn off.

All these disadvantages can be overcome only with great difficulty and considerable cost and cause particularly severe problems where the respective electric component to be mounted on the base plate is relatively heavy itself, so that it cannot be retained by its own electric connection lines, as is the case, for example, with the before-mentioned coils, capacitors, relays, anti-interference coils, or the like.

Now, it is the object of the present invention to provide a method and a device for seating or mounting electric components on a wiring board or printed circuit board in which on the one hand the known method of mounting the housing which carries or receives the electric component by means of detent legs is maintained while, on the other hand, it is ensured that the detent legs cannot by any means come off their engaged position. Also it is ensured by the same means that the corresponding connection wires of the electric component will thread into the associated openings of the printed circuit board practically automatically and in safe alignment. The present invention provides the possibility to achieve simultaneously both objectives, i.e. safe locking and unproblematic threading-in of the connection wire.

ADVANTAGES OF THE INVENTION

The device and the method according to the present invention solve these objects with the aid of the characterizing features of the main claim and/or of claim 4 and provide the advantage that by splitting the housing, which receives or carries the electric component, into two partial housings the housing structure can be changed by locking means of a second type, after having been clipped in place on the carrier plate by means of the locking means of the first type. This is achieved in the preferred embodiment by the fact that the two housing parts can be compressed from a first locking position (condition at delivery) to a second locking position (final condition) so that their outer shape is changed in such a manner that on the one hand the two housing parts are and remain firmly connected with each other, while on the other hand they are absolutely fixed and retained in the locked position by positive contact and engagement by the detent legs of the rear or bottom surface of the board. The component is thereby retained on the circuit board in an absolutely shake-proof and safe manner and cannot be detached therefrom.

At the same time, it is possible with the aid of this process to pass the connection wires (without the use of separate soldering pins) simultaneously and without any problems through corresponding openings in the circuit board so that when the two partial housings have been pressed together, the connection wires will project a predetermined length beyond the rear face of the circuit board, i.e. beyond the conductor side of the board, or will at any rate be positioned in a manner to facilitate the soldering process on this side. This feature may be used alone, or in combination with the form-locking engagement of the detent legs.

It is an advantage in this connection that the housing according to the invention which carries or receives the electric component to be mounted or arranged on the circuit board may be of simple design and is required only to comprise locking means of a first type, namely the conventional detent legs serving to mount the housing on the circuit board, and locking means of a second type by which the dimensions of the housing can be varied for achieving the form-locking engagement of the detent legs in their mounted position in the openings of the circuit board and/or for threading the connection wires through the passages in the circuit board.

The features specified in the sub-claims permit advantageous improvements and developments of the invention. According to a particularly advantageous feature, funnel-shaped receiving channels are provided for the connection wires in the lower housing part, which is located closer to the circuit board and will be described hereafter also as the basic carrier. This funnel-shaped threading aid helps align the connection wires exactly with their respective passage bores, which are provided at pre-determined spacings on the circuit board and into which they will be actually introduced as the housing is being pressed together. In this connection, it would also be possible to equip both partial housings, i.e. the basic carrier and the other partial housing which will be described hereafter sometimes as the component carrier, with guide sleeves arranged to slide within each other and accommodating the corresponding (tinned) connection wires. One end of the guide sleeves is then in direct contact with the printed circuit plate and brings the circuit wire into proper alignment with the respective passage opening.

According to another advantageous feature, the end diameter of the funnel is somewhat smaller than the diameter of the bore in the printed circuit plate or wiring board so that during the telescoping movement of the guide sleeves the wire can be pushed out of the funnel through the bore in the printed circuit board the desired length, without being blocked. This makes it possible also to mount components with thinner wires in their delivered condition directly on the wiring boards, exactly according to the modular dimensions and without the complicated and time-consuming arrangement of additional soldering pins, and to bring the thin wires into a final condition in which they are accessible for the soldering process.

The invention thus does away with the need for any soldering pins which, being an intermediate part, had to be designed in such a manner that on the one hand they were firmly connected with the housing, for example integrally formed with the latter, while on the other hand the thin connection wire of the electric component had to be wound about and soldered to their upper end, whereafter the soldering pin had to be threaded or guided through a corresponding opening in the printed circuit board, when the housing and/or the component was fitted in place. Finally, the soldering process had to be carried out on the other side of the circuit board.

In the ideal application, the invention therefore enables even thin and very thin connection wires to be brought into electric contact, without any problems and without any soldering pins, and to be soldered to the corresponding copper conductors on the back of the printed circuit board, while ensuring at the same time absolutely firm locking and mounting of the whole component on the printed circuit board.

BRIEF DESCRIPTION OF THE DRAWING

Certain embodiments of the invention will be described hereafter with reference to the drawing in which.

DESCRIPTION OF THE EMBODIMENTS

It is the basic concept of the present invention to design a housing for mounting electric components on wiring boards or printed circuit boards as a two-part unit so that the two parts can assume two different locked positions relative to each other, the first locked position giving the housing a more extended structure and being the condition in which the housing is delivered, while in the second locked position the housing exhibits a compressed structure which provides several advantageous possibilities and features which solve a number of problems arising when mounting electric components on circuit boards. In the compressed condition of the housing, for example, locking rails or supporting levers for the detent legs intended to secure the housing on the wiring board may be extended simultaneously so that the detent legs are engaged from behind in a form-locking manner and the passage opening in the wiring board is closed completely whereby any subsequent detachment of the component is excluded. On the other hand, the compressing movement may simultaneously cause connection wires of the electric component to be guided by means of longitudinal channels into correspondingly aligned receiving and passage openings in the wiring board so that they appear and project on the other side for subsequent soldering.

Before going into certain embodiments of the invention it should be noted that these are to be understood only as examples and that they do not in any way limit the invention, as regards the dimension or arrangement of the individual elements. The invention will be understood best when regarding the representations of FIGS. 6a and 6b in connection with FIGS. 1 to 5, FIGS. 1 and 2 showing a first part of the housing, namely the basic carrier 10 to be fixed and locked on the wiring board or printed circuit board, and FIGS. 3 and 4 showing the second part of the housing, namely the component carrier 11 which can be locked on the basic carrier in two different locking positions.

Figure 2:
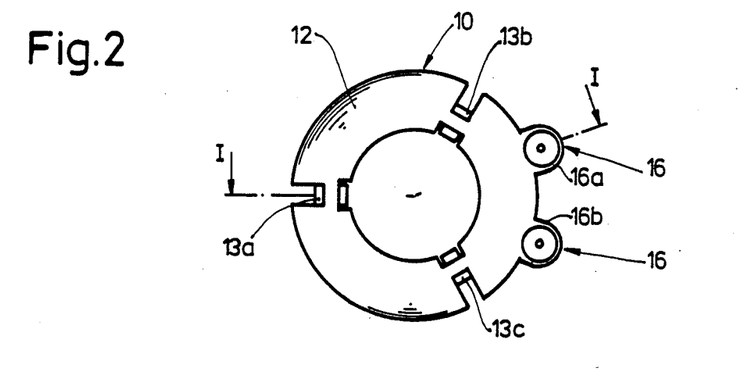
FIG. 2 shows a top view of the partial housing according to FIG. 1.

The representation of FIG. 2 shows that the basic carrier 10 comprises an annular main body 12 with two different component groups arranged thereon for the purposes mentioned above, namely locking means of a first type designated by reference numeral 13 and comprising, in the embodiment shown, three detent legs 13a, 13b and 13c spaced about the circumference of the basic carrier by 120° each. The detent legs 13a, 13b and 13c are designed in the usual manner; preferably, they are formed integrally with the basic body 12 or fixed to the latter, and comprise an arm 14 extending vertically downwards, i.e. in the direction of the printed circuit board or wiring board, and a locking nose 15 extending transversely therefrom, the whole unit tapering downwardly, i.e. in the direction of the passages in the circuit board so that they can be introduced easily. According to the general embodiment of the invention, the shoulder 15a of the locking nose of each detent leg 13a, 13b, 13c, or the detent means 13, then engage the rear or—in the present case—the conductor side of the printed circuit board, if the upper side is designated as the component side.

Figure 1:
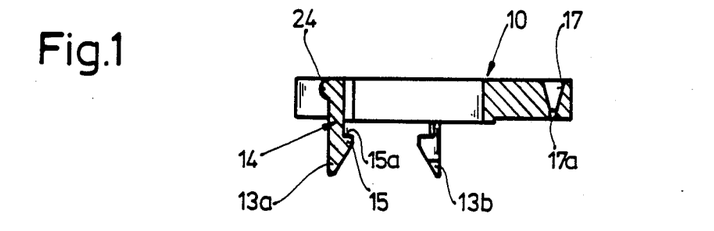
FIG. 1 shows a section through a first partial housing (basic carrier) along line I—I in FIG. 2.

In the embodiment shown, the basic carrier 10 is further equipped with two guide elements 16 for presenting, threading-in and passing the electric connection wires of the respective electric component carried or received by the element carrier, the guide means 16 consisting in the illustrated embodiment of two lugs 16a, 16b projecting outwardly from the main body 12 and provided with a funnel-shaped tapering inner bore 17—as can be seen best in FIG. 1—ending in an opening 17a whose diameter is preferably somewhat smaller than the diameter of the passage openings for the electric lines in the wiring board, so that no inwardly projecting edges are obtained that might hinder the passage of the electric connection to be threaded in. This arrangement will be described in more detail further below, in connection with FIG. 7.

Figure 3:
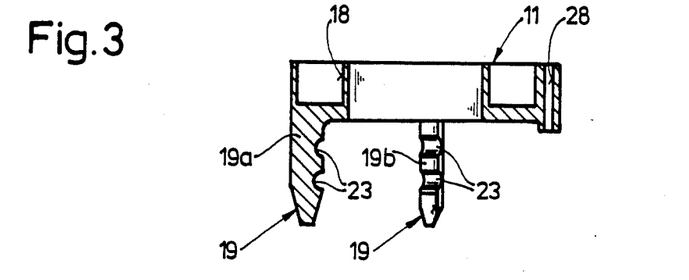
FIG. 3 shows a section through the second partial housing (component carrier) along line III—III in FIG. 4.
Figure 4:
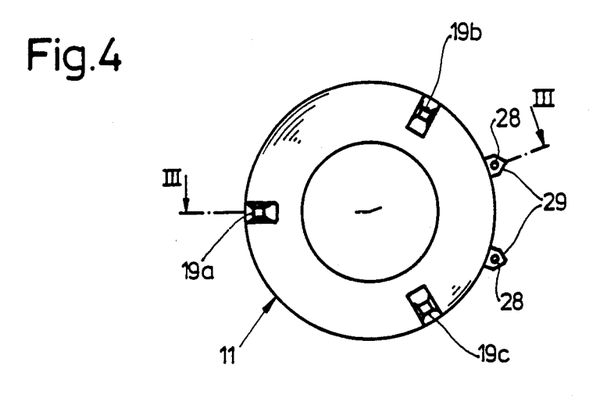
FIG. 4 shows a bottom view of the partial housing according to FIG. 3.

This first housing part serving as basic carrier 10 is connected with a second housing part, namely the component carrier 11, as shown in FIGS. 3 and 4. The connection is effected by means of locking means of a second type permitting two different relative locked positions to be assumed by the two housing parts, namely the basic carrier 10 and the component carrier 11.

Figure 6A:
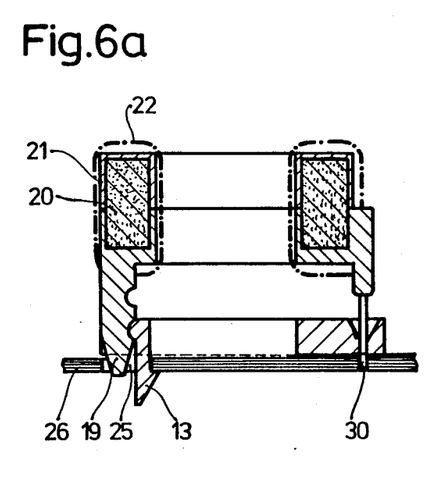
FIGS. 6a and 6b show sections along line I—I and III—III in FIGS. 2 and 4, respectively, through the housing intended to receive electric components according to FIG. 5, comprising the two partial housings, one in the extended first locked condition (FIG. 6a) and one in the compressed second locked condition (FIG. 6b)
Figure 6B:
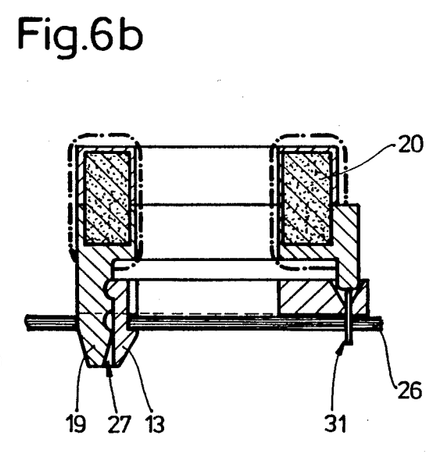

Both the component carrier and the basic carrier as such may, accordingly, also be adapted to the shape of the electric component to be connected with the wiring board, in which case both housing parts must be designed in an appropriate manner to permit the locking means of the first type to perform their function. In the case of the embodiment shown, the housing serves to accommodate and support an anti-interference coil, for example a radio interference suppression coil, so that the component carrier 11 comprises an open annular channel 18 designed for receiving a ring core. In the embodiment shown, the annular channel 18 accommodates only half the ring core 20 (see FIGS. 6a and 6b); the structure of the component carrier is completed in this case by an upper annular cover 21 closing the top of the annular channel 18, with the ring core 20 accommodated therein. One ensures in this manner simultaneously the electric insulation of the ring core 20. The coil winding 22 is then guided around both parts and the ring core embedded therein, as indicated in FIGS. 6a and 6b, so that the winding unites the two halves of the channel accommodating the ring core to provide a single unit. It is of course also possible—and this should be noted immediately at this point—to give the component carrier a different design for the accommodation of such electric coils, which is a preferred application of the present invention. For example, a core may be used without such insulating plastic channels and the necessary insulation material is applied to the core itself by sintering or varnishing. In this case, the channel 18 is not needed. If other components are to be mounted, the supporting means and geometrical conditions of the component carrier 11 must of course be designed in such a manner that the respective electric components can be accommodated within very confined space and are safely retained therein. It goes without saying that in this case, too, the basic carrier 10 has to be adapted to the shape of the component carrier which in turn depends on the type of electric component concerned. In any case, the basic carrier is provided with the locking means of the first type, i.e. with the detent legs, and the component carrier 11 and the basic carrier 10 together are equipped with the locking means of the second type permitting the two parts to assume two different locking positions.

In the illustrated embodiment, the locking means of the second type are designated by reference numeral 19 and comprise webs 19a, 19b and 19c extending downwardly from the circumference and being spaced about the latter likewise by 120°, which webs enclose in the present case the basic carrier and formed on their insides are spaced locking recesses 23 which are engaged by a locking projection 24 provided on the basic carrier (see FIG. 1).

The design and function of these locking means of the second type may be selected as desired, provided that they ensure that the two housing parts, namely the basic carrier and component carrier, can be locked in different vertical positions relative to each other (related to the distance of the component carrier from the wiring board).

To this end, the recesses 23 in the webs 19a shown in FIG. 3 are provided at different heights so that in the first locking position—shown in FIG. 6a—the locking projection 24 engages the lower locking recess 23 of the component carrier 11, while the locking projection 24 jumps into the second, upper locking recess of each web 19a so that the compressed condition shown in FIG. 6b is obtained, when additional pressure is exerted upon the component carrier when the wiring board is already locked with the basic carrier. At the same time, the following happens:

1. According to a preferred embodiment of the invention, the locking projection 24 is arranged on the side of each detent leg 13a facing away from the locking nose 15, as shown in FIG. 1, so that the webs 19a, 19b, 19c, too, are oriented circumferentially towards these detent legs.

During the downward-movement into the second locking position, in which the housing parts are locked to each other, the webs 19 come to lie behind the respective detent leg 13 so as to fill completely the previously free space in the opening 25 of the wiring board. In this compressed position according to FIG. 6b, the parts are now in positive and flush contact with each other, at least in the area of the opening in the wiring board, as can be seen best at 27. Accordingly, the detent legs 13 cannot be detached from the openings in the wiring board.

It goes without saying that the locking means of the second type formed by the locking recesses 23 and the locking projections 24 in the figures explained above may also be arranged at a different point where they can perform the function of locking the two halves of the housing, namely the basic carrier and the component carrier, in two different locking positions relative to each other. In any case, it is essential that for engaging the locking means of the first type, i.e. the detent legs 13, the webs 13 must be pressed behind the detent legs, as explained above, so that they serve at the same time as retaining means for the locking means of the the first type. In the illustrated embodiment of the invention, the webs 19, distributed over the circumference as webs 19a, 19b, 19c, perform simultaneously two functions, carrying firstly the locking means of the second type and serving at the same time for locking the locking means of the first type in the basic carrier.

2. Simultaneously with this compression movement, the electric connection wires of the respective electric component are guided fully through the wiring board 26 and are prepared for the soldering process. As regards this function, it should be noted initially in connection with the embodiment shown that after insertion of the ring core 20 into the receiving channel 18 of the component carrier 11, and after fitting the cover 21, the coil winding 22 is wound about the annular component carrier thus formed by the two halves. The ends of the winding is introduced into holding channels 28 provided in the form of bores in projections 29 of the component carrier projecting in this case beyond the annular form of the housing. The electric connection wires may be pushed through the holding channels 28 far enough to ensure that when the two halves of the housing, namely the basic carrier and the component carrier, are moved together, they will project into the funnel-shaped portion 17, which is of course aligned with the retaining channel 28, or into the tapering portion 17a or even beyond the latter, depending on the circumstances of each particular case, for example on the thickness and rigidity of the connection wires.

Then the total housing comprising the basic carrier 10 and the component carrier 11, which are now retained in their first extended locking position, as shown in FIG. 6, is mounted on the carrier plate 26, and the locking means of the first type, i.e. the detent legs 13 are brought into engagement with the associated recesses 25 in the carrier plate 26. The first locking position of the two housing parts, namely the basic carrier and the component carrier, shown in FIG. 6a is, advantageously, the condition in which the housing is delivered.

The passage bores 30 for the electric connection wires of the components arranged in the wiring board 26 are aligned with the guiding means formed by the retaining channel 28 and the funnel-shaped portion 17 so that during the further compression movement, i.e. when the housing is moved into the compressed position shown in FIG. 6b, the ends of the electric connection wires come to project the desired length beyond the back of the wiring board 26, as indicated at 31. The housing for the electric components now assumes its final locking position, the locking means of the first type are absolutely locked in their receiving openings 25 in the wiring board 26, and the electric connection wires are ready to be soldered.

It goes without saying, and has been mentioned before, that the embodiment shown represents only one of numerous possibilities provided by the present invention. So it is possible, for example, to give the locking means of the second type a completely different design and arrangement, as compared to the retaining webs 19. It is, for example, imaginable to give the walls of the basic carrier and the component carrier facing each other a saw-tooth structure so that the teeth can be moved past each other during the compression movement, but will remain locked undetachably in the desired end position. However, it is also possible to design the locking means of the second type in such a manner that in the first initial locked position of the two housing parts the special locking projections and locking recesses can be detached in a simplified manner by exertion of pressure, for example due to their particular shape, while in the end position any such detachment is excluded by the particular shape.

Figure 5:
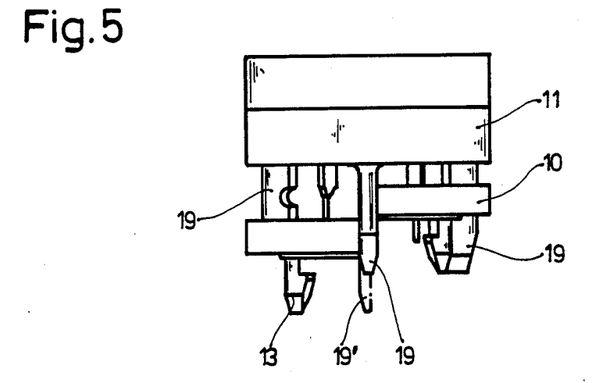
FIG. 5 is a side view showing the two connected partial housings, namely the basic carrier and the component carrier, once in the pre-mounting condition (delivery condition) to the left of the central separating line, and once in the compressed condition (assembled final condition) to the right of the separating line.

The perspective representation of FIG. 5 shows the housing for the electric component, in the extended position—on one side of the center line—and in the compressed final condition—on the other side of the center line.

Regarding now numerical values—which do not, however, restrict the invention—the housing may in the first locking position—as delivered—be 2 to 3 mm higher than in the second locking position. During assembly, and after the detent legs of the basic carrier have been introduced into their locking position in the wiring board, the component carrier is pressed down until their second final locking position and, if desired, the locking position of the two parts of the housing is reached. Simultaneously, the connection wires slide through the bores in the wiring board and the locking webs engage the detent legs from behind in this position. However, it should be noted that the object of the invention is fulfilled even if only one of these features is implemented, because the invention is already realized and used if only one of the features, for example locking of the detent legs (in which case the electric connection must be realized by some other means) or establishment of the electric connections (in which case locking must be effected by some other means or the original locking position is maintained) is carried out.

Figure 7:
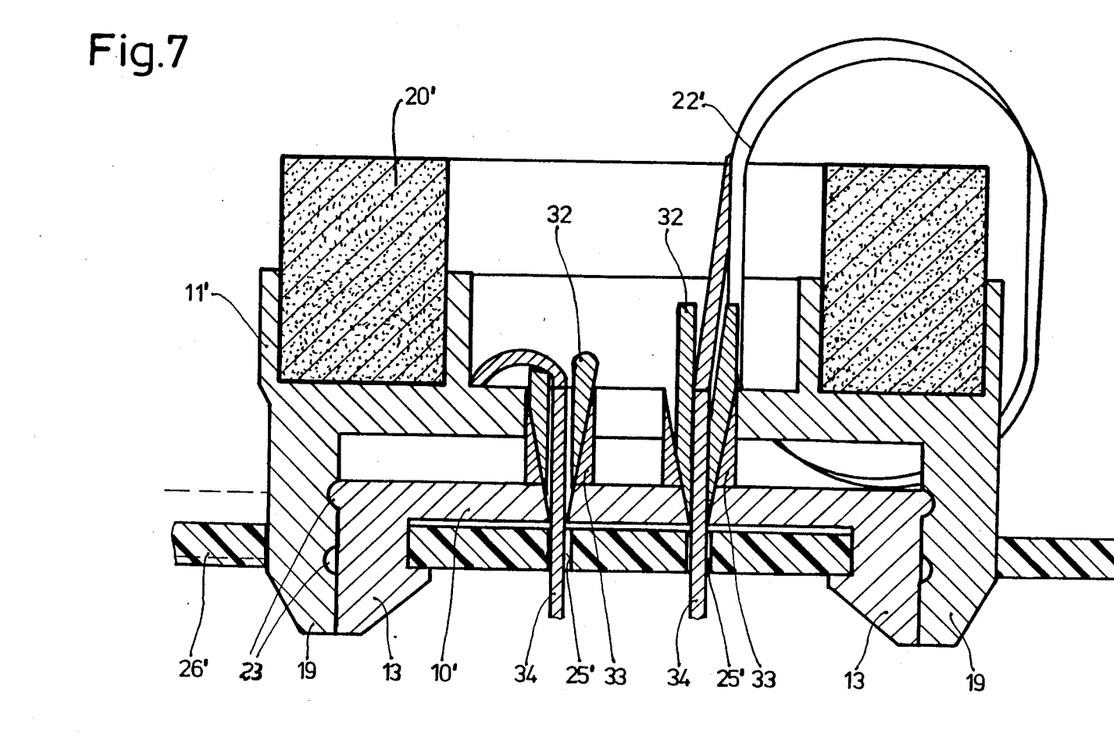
FIG. 7 shows another embodiment of means for mounting electric components on a wiring board where the wire guiding channels comprise two sleeves arranged for telescoping engagement of each other.

The representation of FIG. 7 shows a different possibility of guiding and positioning the connection wires of the electric component. This embodiment starts out again from the basic housing shape as shown in FIGS. 1 to 4, comprising a lower basic carrier 10' and a component carrier 11' mounted on a circuit board 26' in the final position shown in the drawing. Again, the component consists of an anti-interference coil comprising a core 20' and a winding 22' which is shown with its maximum winding diameter. The upper cover part serving as core insulation is not shown in the drawing. One clearly sees at 23 the two locking positions for the locking means of the second type, and also the engagement and retention of the detent legs by the retaining webs 19.

A difference can be seen in the way the electric connection wires are guided in the case of this embodiment, in sleeves arranged to slide in each other and provided at corresponding spacings—a solution which is recommended preferably for less rigid wires of thinner diameters which are not tinned (by tinning the wires, the latter can be given improved rigidity). The sleeves are arranged both on the component part, where they are designated by reference numeral 32 and from which they extend downwardly, and on the basic carrier, where they are designated by reference numeral 33 and from which they extend upwardly opening towards the upper end in the manner of a funnel. The lower sleeves 33 accommodate the end portions of the upper sleeves 32 in the first locking position of the two housing parts so that when the parts are finally pressed together, the connection wires 34 are guided without any problems in the inner bores of the sleeves and introduced in a defined manner through the tapering end portion of the sleeve into passages 25' in the circuit board. As has been mentioned before, the ends of the inner bores of the sleeves, which are directed towards the openings 25' in the circuit board, are slightly smaller or narrower than the openings in the circuit board so that the connection wires 34 cannot be blocked or trapped by them as they pass through these openings.

Figure 8A:
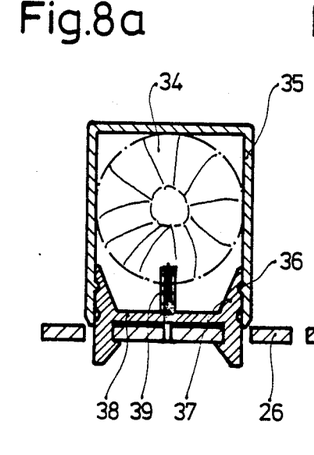
FIGS. 8a and 8b show a third embodiment of the invention comprising a two-part housing, already mounted on the respective wiring board or printed circuit board, in the first locked position and in the compressed second locked position, respectively.
Figure 8B:
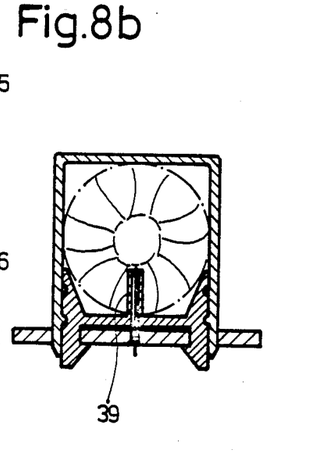

It has been mentioned before that the invention can be used for any type of electric component that has to be connected with a wiring board or printed circuit board. In the case of the embodiments shown (anti-interference) coils have been selected as as example. These coils can be connected according to the invention both in horizontal and in upright positions. A possible embodiment for upright connection of coils 34 is shown in FIGS. 8a and 8b. Here, the component carrier—designated by reference numeral 35—exhibits a box-like or rectangular shape with walls on all sides, but an open bottom. Its inner wall is provided with locking projections 36 aligned with locking recesses provided on upwardly projecting wall portions 37 of the basic carrier 38. Further, there may be provided two guide necks 39 for the connection wire which receive the coil 34 between them and in which the electric connection wires of the coil are initially inserted. In the embodiment shown, these guide necks are arranged only on the basic carrier 38. When the upper housing part, i.e. the component carrier 35, is pressed down the coil naturally follows this movement and its electric connection wires are pushed further through the guide neck 39 and through the opening in the printed circuit 26 aligned therewith.

The representations of FIGS. 8a and 8b are intended in particular to illustrate that the invention permits a plurality o different solutions using its basic idea which consists in providing two parts with different locking positions where the described advantages are achieved when the two housing parts are transferred to their final locking position during assembly.

According to another embodiment of the present invention, which may be particularly advantageous under certain circumstances, the second locking operation by which the two housing parts are moved from their preliminary locking position into their final locking position is subdivided once more which means that the locking step carried out with the aid of the first locking means, by which the housing is connected with the wiring board or printed circuit board, is followed by a second partial locking step.

This embodiment of the invention starts out from the realization that when heavier electric components are used, the locking means of the first type, i.e. the detent legs with their locking nose for the printed circuit board or wiring board, must be comparatively sturdy so that some force may be required for pressing the detent legs into correspondingly adapted slots or passages in the circuit board. The invention provides for such cases—and this application is of course deemed to be particularly suited for any electric components, not only for such of a heavy design—that the initial passages in the circuit board are made sufficiently large so that the locking means of the first type (detent legs 13) can easily be introduced into and passed through the corresponding primary openings in the circuit board. Thereafter, the whole housing is rotated either in clockwise or in counter-clockwise direction by a predetermined amount which should at least correspond to the width of each detent leg (not shown in the drawing). This rotary movement brings the detent legs into a narrower or tapered partial area of the recess in the circuit board which, starting out from the primary opening, extends of course in the direction of rotation, i.e. at a circular angle, although this need not necessarily be considered in designing the openings in the circuit board, due to the small amount of the rotary movement. It appears that as a result of this rotation and the movement of the detent leg into a considerably narrower area of the opening, each detent leg is retained absolutely firmly in the corresponding bore in the circuit board, on the front and on the rear, i.e. in the transverse direction corresponding to the extention of its locking nose. This is due to the fact that the portion of the opening in the circuit board following the primary opening is just as wide as the respective detent leg so that the latter is retained by the opening in form-locking engagement.

This embodiment of the invention provides, apparently, another advantage: Due to the fact that the detent legs, as the locking means of the first type, can be introduced with more ease into the larger primary openings in the circuit board, it is not necessary to exert an amount of pressure that might under certain circumstances cause the locking means of the second type to be engaged already at this time; in any case, this risk can be left out of regard during assembly.

However, it is of course clear that one cannot from the very beginning exclude an backward rotary movement so that it is an additional feature of this embodiment of the invention that after rotation to the predetermined angular stop position in which the passage openings for the electric connection wires in the circuit board are exactly aligned with the corresponding sleeve guides and/or any other guiding aids for the connection wires, the remaining assembly process is the same as described above. This means that once the rotary end position has been reached, the two housing parts are pressed together so that they come into locked engagement and reach their final locking position, however with the exception that the locking webs of the second housing part, i.e. of the component carrier, which are moved downwardly by this process into their locking position, do not assume a locking position behind the detent legs as locking means of the first type, but come to lie beside the latter so as to fill the free space (primary opening) in the circuit board resulting from the rotary movement. This prevents the detent legs and the housing as a whole from returning into their original angular position.

The remaining functional processes, as regards the threading-in and passage of the electric connection wires, are then the same as described above. They are not influenced in any way by the preceding additional rotary movement, except that the passage openings for the electric connection wires must now be aligned with the guide means for the connection wires after the housing has reached its angular end position, after rotation.

All features mentioned or shown in the above description, the following claims and the drawing may be essential to the invention either alone or in any combination thereof.

I claim:

1. A method for positioning an electric component on a printed circuit board, comprising the steps of:
   providing a housing having first and second sections and first and second locking means;
   positioning the electric component on said first section of said housing so that the electric component is movable with the first section;
   mounting the housing on the circuit board by engaging said first locking means on said second section of the housing with the circuit board to effect a locking state; and
   moving the first section of the housing toward the second section of the housing and the circuit board so as to effect operation of said second locking means on the housing and to position the electric component on the circuit board, the first section remaining in the locked state on the second section throughout the step of moving.

2. The method of claim 1, in which the circuit board includes a plurality of openings and said first and second locking means comprise depending legs, comprising the further steps of pushing said first locking means legs into the plurality of openings, and thereafter pushing said second locking means legs into said plurality of openings adjacent said first locking means legs.

3. The method of claim 2, in which each of said plurality of openings comprises an arc having an enlarged and a narrow section, comprising the further steps of inserting said first locking means leg through said enlarged section of said opening, and rotating said housing until said leg is received in the narrow portion of said opening.

4. The method of claim 3, in which said component includes connecting wires, and the printed circuit board includes openings for said connecting wires, including the further steps of depressing said first section relative to said second section after rotation of said housing to force said connecting wires through said connecting wire openings in said board.

5. The method of claim 3, in which said first section is moved toward said second section after said housing has been rotated to cause said second locking means legs to enter said narrow section of said openings.

6. The method of claim 1, further comprising the step of:
   mounting the electric component onto the circuit board.

7. The method of claim 1 including the further step of guiding electric contact elements of the electric component simultaneously closer to said board when moving said first section towards said second section.

* * * * *